(12) United States Patent
Iannuzzelli

(10) Patent No.: US 6,298,363 B1
(45) Date of Patent: Oct. 2, 2001

(54) ADAPTIVE WINDOWING OF FFT DATA FOR INCREASED RESOLUTION AND SIDELOBE REJECTION

(75) Inventor: Russell J. Iannuzzelli, Bethesda, MD (US)

(73) Assignee: The Johns Hopkins University, Baltimore, MD (US)

(*) Notice: Subject to any disclaimer, the term of this patent is extended or adjusted under 35 U.S.C. 154(b) by 0 days.

(21) Appl. No.: 09/191,665

(22) Filed: Nov. 13, 1998

Related U.S. Application Data

(60) Provisional application No. 60/065,293, filed on Nov. 13, 1997.

(51) Int. Cl.$^7$ ..................................................... G06F 17/14
(52) U.S. Cl. ............................................................. 708/400
(58) Field of Search ............................... 708/400, 403–404

(56) References Cited

U.S. PATENT DOCUMENTS

| | | |
|---|---|---|
| 4,633,171 | 12/1986 | Storck et al. . |
| 5,349,359 | 9/1994 | Dallaire et al. . |
| 5,508,706 * | 4/1996 | Tsou et al. ............................ 342/192 |
| 5,767,793 * | 6/1998 | Agravante et al. .................. 340/903 |

\* cited by examiner

*Primary Examiner*—Tan V. Mai
(74) *Attorney, Agent, or Firm*—Carla Magda Krivak

(57) ABSTRACT

Adaptive windowing of Fast Fourier Transform (FFT) data to reduce spectral leakage and increase sidelobe rejection. The adaptive windowing is extended to 5 and 7 point convolution formulas. Thus, the present invention extends the non-static shift-variant data adaptive window generated from a spatial variant apodization. The extensions are achieved by using the window structure of multiple cosines. The sidelobe leakage of the adaptive windows is extremely small, the signal-to-noise ration is higher than conventional techniques and spectral detection is possible with higher order windowing.

6 Claims, 12 Drawing Sheets

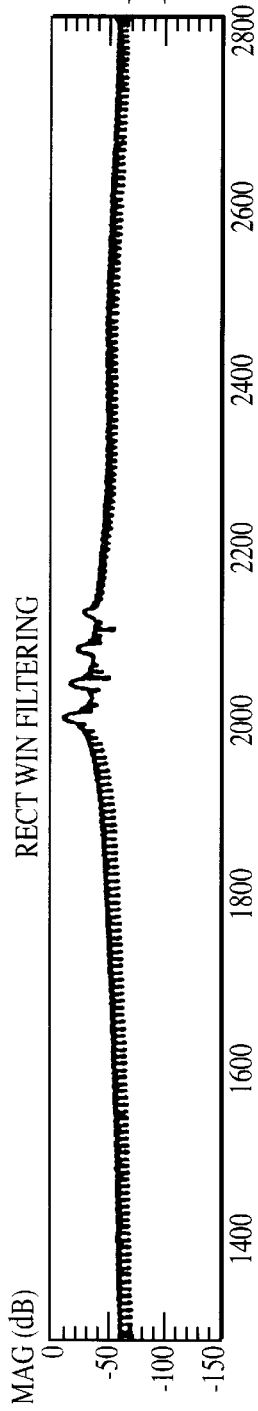
FIG. 4A — RECT WIN FILTERING
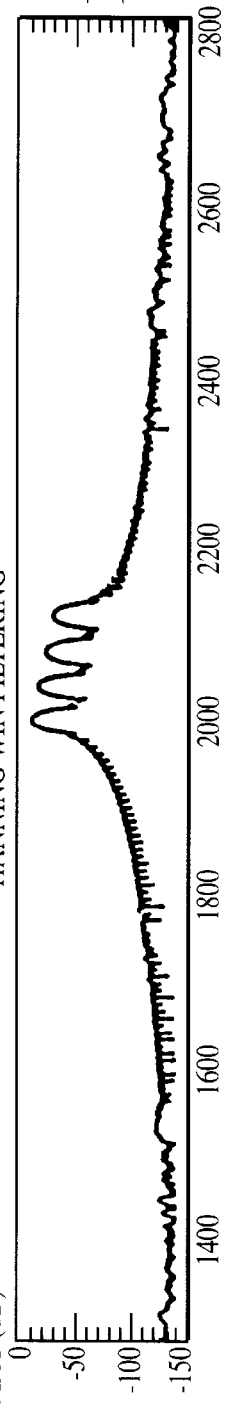
FIG. 4B — HANNING WIN FILTERING
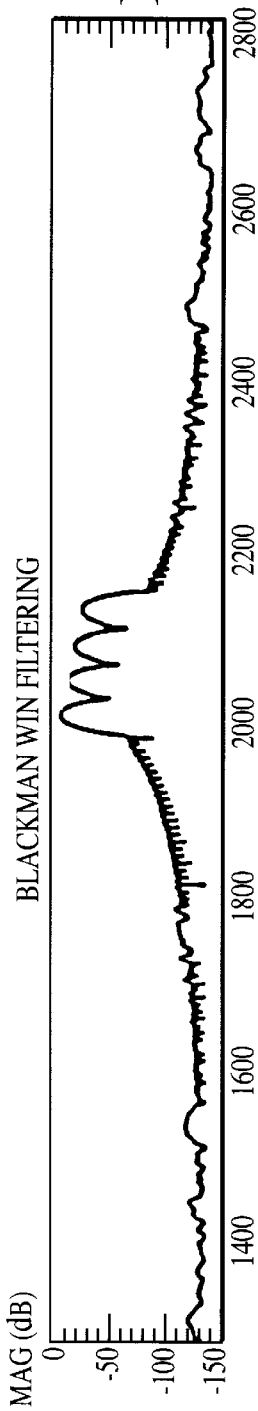
FIG. 4C — BLACKMAN WIN FILTERING
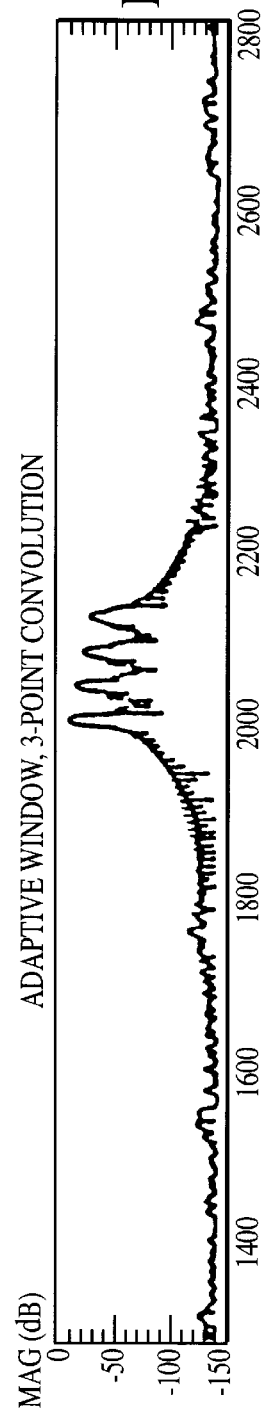
FIG. 4D — ADAPTIVE WINDOW, 3-POINT CONVOLUTION

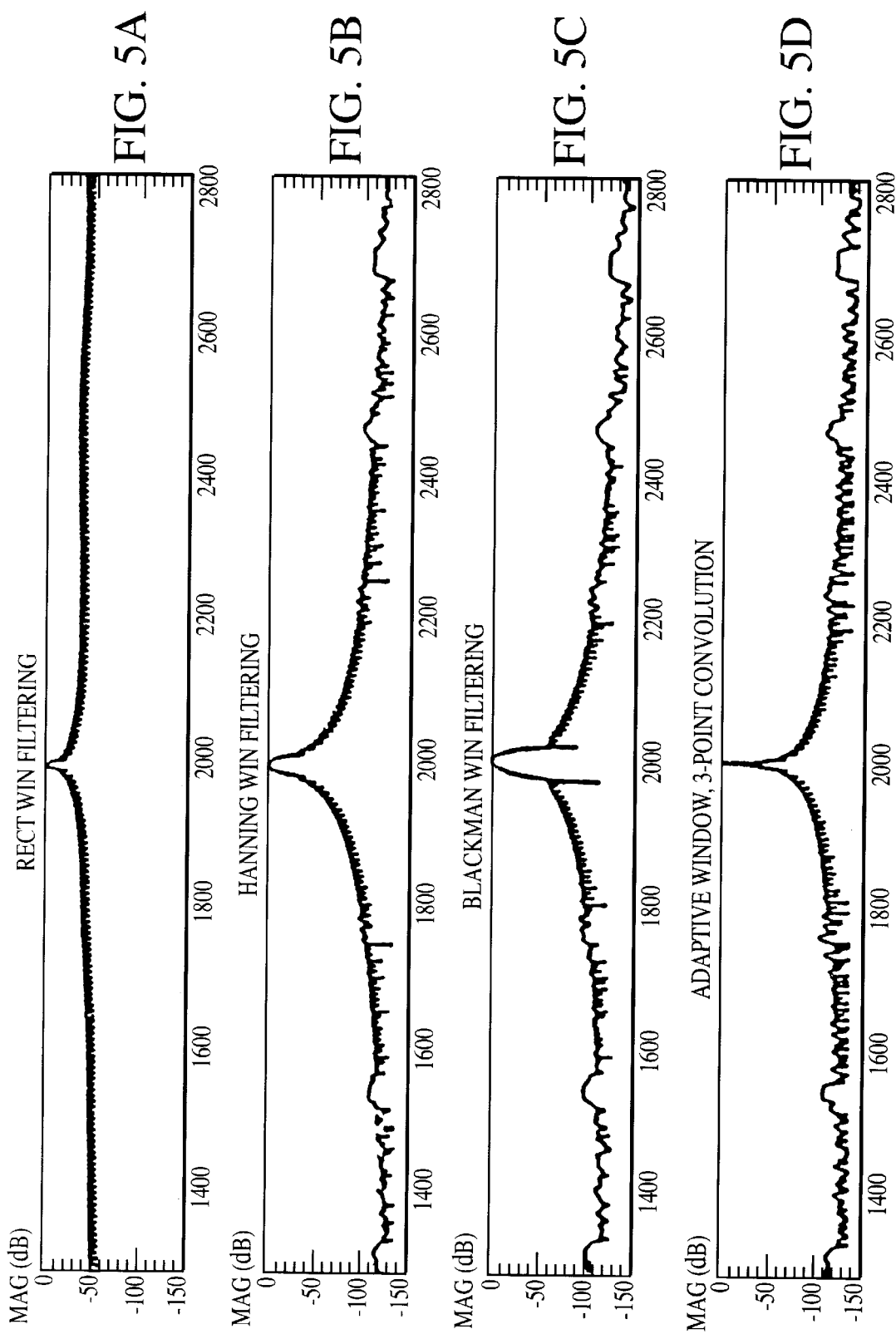

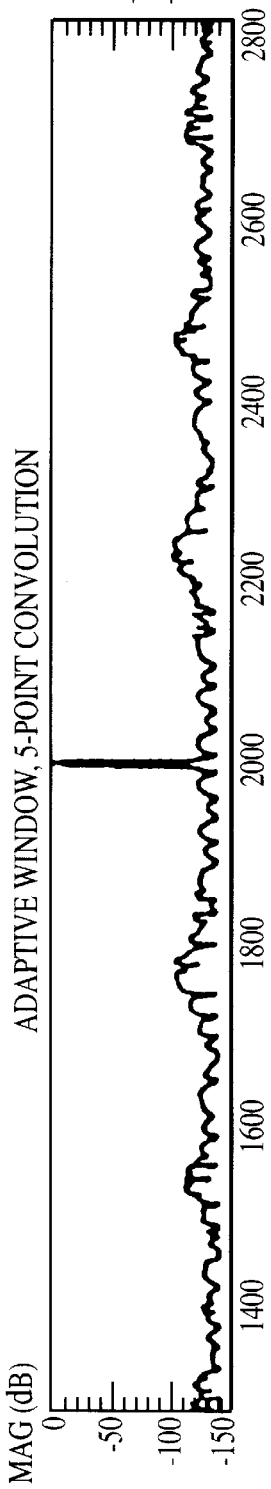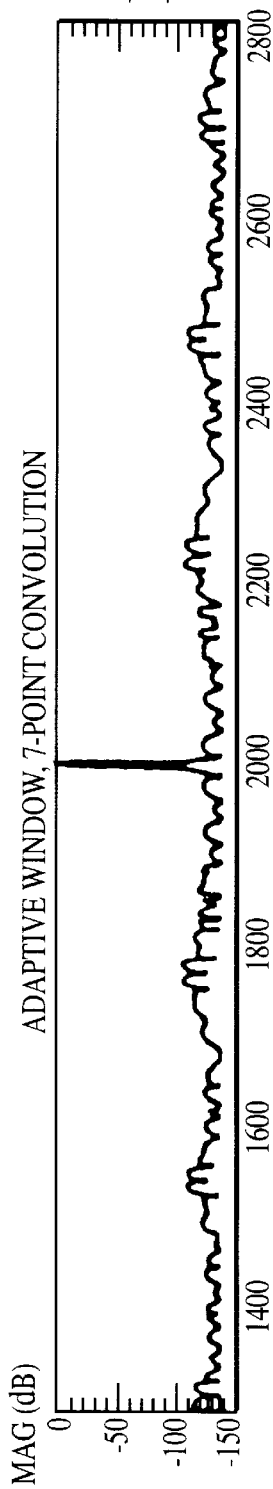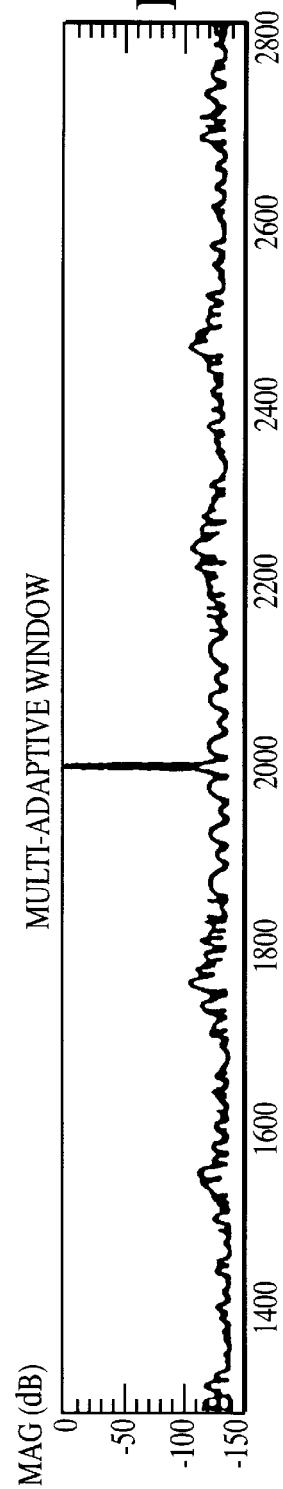
FIG. 5E
FIG. 5F
FIG. 5G

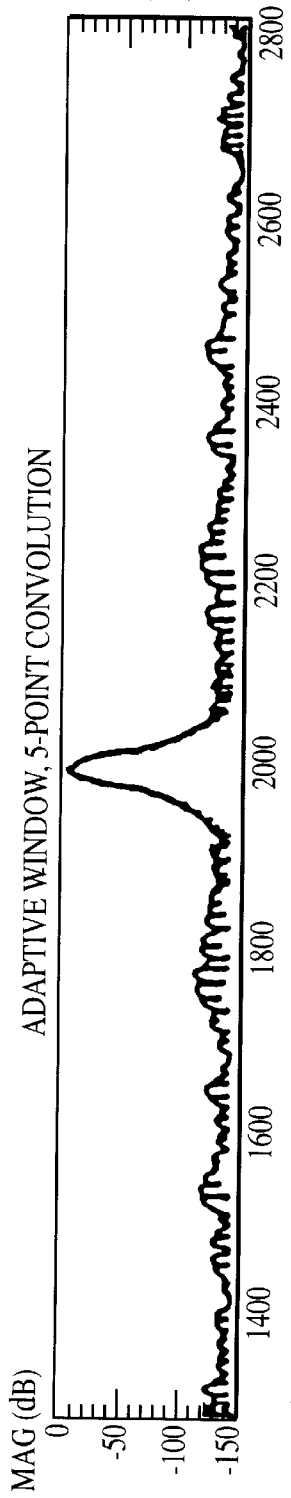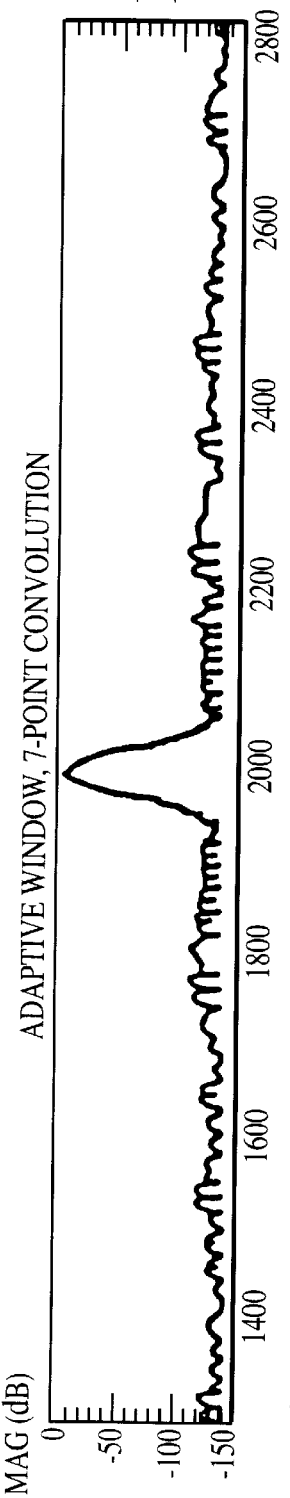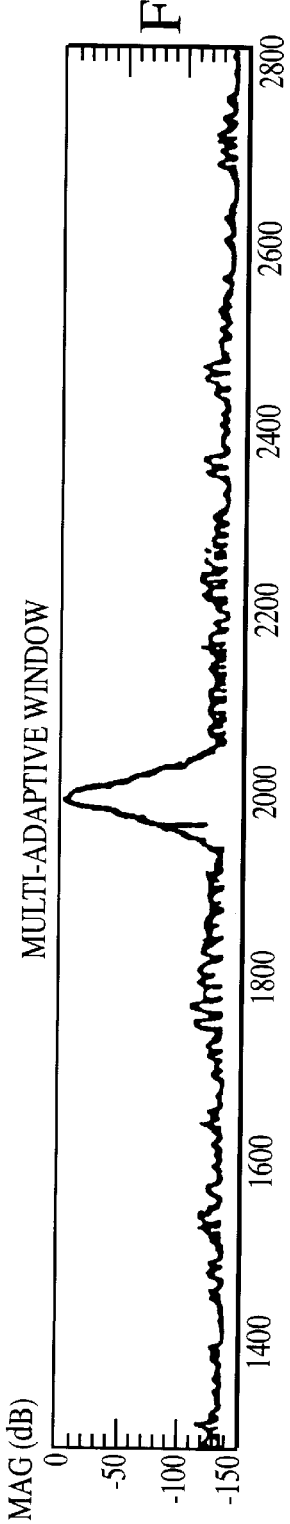
FIG. 6E
FIG. 6F
FIG. 6G

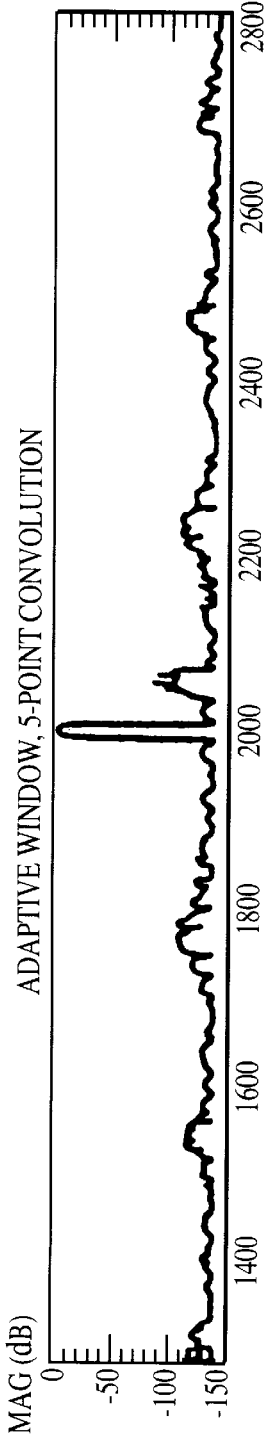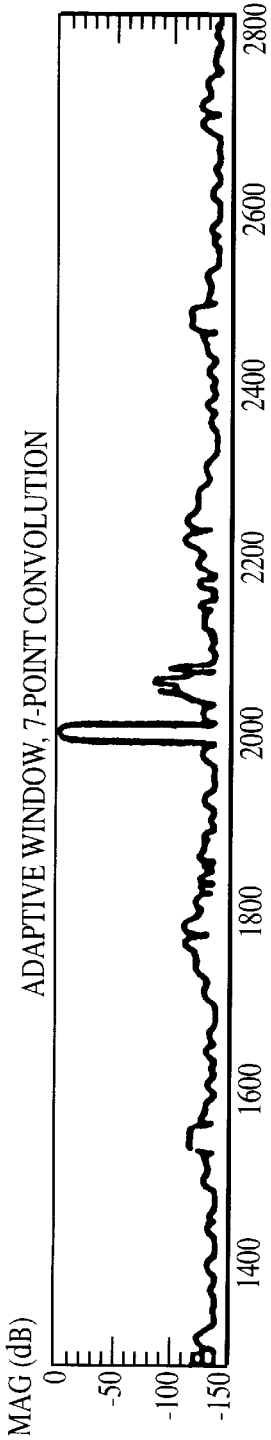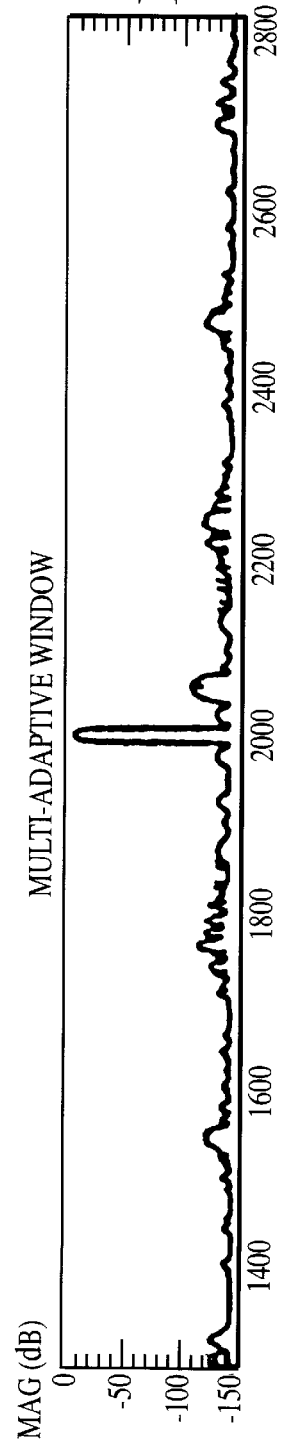

ADAPTIVE WINDOWING OF FFT DATA FOR INCREASED RESOLUTION AND SIDELOBE REJECTION

CROSS-REFERENCE TO RELATED APPLICATION

This application claims the benefit of prior filed copending U.S. provisional application serial No. 60/065,293, filed Nov. 13, 1997.

STATEMENT OF GOVERNMENTAL INTEREST

The Government has rights in this invention pursuant to Contract No N00039-95-C-0002 awarded by the Department of the Navy.

BACKGROUND OF THE INVENTION

1. Field of the Invention

This invention relates to adaptive windowing of Fast Fourier Transform (FFT) data to reduce spectral leakage and increase sidelobe rejection. More specifically, the present invention is directed to methods using multiple cosine window structures with 5- and 7-point convolution formulas to extend shift-variant data adaptive windows used in spatial variant apodization digital image processing applications.

2. Discussion of the Related Art

Fast Fourier Transforms (FFTs) are used for processing observed signals. Weighing functions, referred to as windows, are applied to the data to reduce the spectral leakage associated with finite observation intervals. Thus, in applying windows to a sample data harmonic analysis, undesirable effects due to spectral leakage are attempted to be removed. An indicator of how well a window suppresses leakage is the peak sidelobe level. Another indicator is the asymptotic rate of fall off of the sidelobes. However, an undesirable property associated with windowing is that the main lobe is widened. This results in a loss of spectral resolution.

To reduce spectral leakage, typical FFT based spectral analysis usually incorporates pre-transform windowing. Standard windows taper the finite length records of data at the edges, thus reducing sidelobe interference. However, because typical FFT based processing of time series data usually includes a time-domain windowing operation, leakage due to discontinuities of the data at the edges of the finite records tend to mask significant components of the signal. This is because the Discrete-Fourier Transform periodically extends the finite data records. In standard windowing techniques, the finite record is multiplied by a time-domain window that tapers the data to zero on the edges. The tapering of the data at the edges has the effect of spectrally reducing the sidelobes of the window. Associated with this windowing is the undesirable property that the mainlobe is widened. This results in a loss of spectral resolution.

It is necessary that a technique be developed to increase spectral resolution and sidelobe rejection.

SUMMARY OF THE INVENTION

It is an object of the present invention to provide a new class of windows that are not shift-invariant.

It is another object of the present invention to provide shift-variant windows that are data dependent and exhibit excellent sidelobe rejection and spectral resolution on simple spectra.

It is a further object of the present invention to provide better resolution and signal-to-noise resolution than other known windowing techniques.

These objectives, together with other objectives and advantages which will be subsequently apparent, reside in the details of the method and operation as more fully described and claimed hereinafter, reference being had to the accompanying drawings forming a part hereof, wherein like reference numerals refer to like parts throughout.

BRIEF DESCRIPTION OF THE DRAWINGS

FIGS. 4A, 4B, 4C, 4D, 4E, 4F and 4G are spectral plots of four closely spaced tones having decreasing amplitude with rectangular window filtering, Hanning window filtering, Blackman window filtering, adaptive windowing-3 point, adaptive windowing-5 point, adaptive windowing, adaptive windowing-7 point and multi-adaptive windowing, respectively;

FIGS. 5A, 5B, 5C, 5D, 5E, 5F, and 5G are spectral plots of a single tone for rectangular window filtering, Hanning window filtering, Blackman window filtering, adaptive windowing-3 point, adaptive windowing-5 point, adaptive windowing-7 point and multi-adaptive windowing, respectively;

FIGS. 6A, 6B, 6C, 6D, 6E, 6F, and 6G are spectral plots of two tones for rectangular window filtering, Hanning window filtering, Blackman window filtering, adaptive windowing-3 point, adaptive windowing-5 point, adaptive windowing-7 point and multi-adaptive windowing, respectively;

FIGS. 8A, 8B, 8C, 8D, 8E, 8F, and 8G are spectral plots of tones at bin 200 and bin 2050 for rectangular window filtering, Hanning window filtering, Blackman window filtering, adaptive windowing-3 point, adaptive windowing-5 point, adaptive windowing-7 point and multi-adaptive windowing, respectively.

DESCRIPTION OF THE PREFERRED EMBODIMENTS

Figure 1:
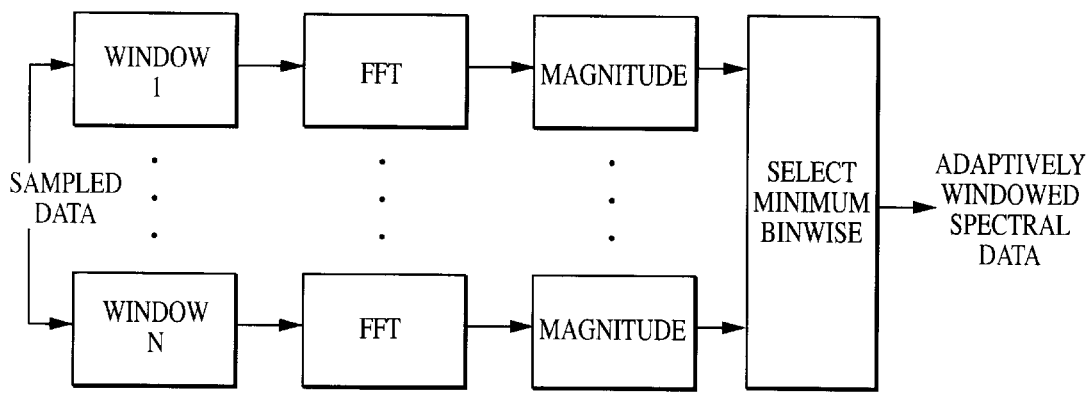
FIG. 1 is a diagram showing multi-apodization windowing according to the prior art.

The present invention uses multiple cosine window functions with 5- and 7-point convolution formulas to extend shift-variant data adaptive windows used in spatial variant apodization digital image processing applications. For instance, in the preferred embodiment, it is used to process each pixel of an image, how-so-ever generated, to enhance mainlobe amplitude relative to the attendant sidelobes. Because of its broad application potential, no attempt is made herein to identify the actual source of the data being processed other than to limit it to data that may be processed using Fast Fourier Transform (FFT) techniques and which is referred to herein as fast Fourier transform data. It is concerned with temporal weighting functions of the form:

$$\omega_k(t) = \frac{1}{N}\sum_{k=0}^{K} a_k \cos\left(\frac{2\pi tk}{NT}\right) \quad (1)$$

for $[t] \leq TN/2$ is the sampling period and $k/NT$ is the discretized frequency. These are termed the raised cosine functions of order K. This can be written as $$\omega_k(t) = \frac{1}{N}\sum_{k=0}^{K} a_k(-1)^k \cos\left(\frac{2\pi tk}{NT}\right) \quad (2)$$

for $0 \leq t \leq T(N-1)$, T. The reason that these windows are important is that they have distinct short convolution formulas for computation in the frequency domain. This property will be used to establish optimal coefficient selection in the frequency domain. It is shown that the roll-off in sidelobe level is a function of the smoothness of the window at the edges, $t=0, t=T(N-1)$. That is, the discontinuities drive the asymptotic behavior of the spectral shape of $\omega_k(t)$ for large frequencies. Requiring values of the weighting fu be zero at the edges implies:

$$\sum_{k=0}^{K} (-1)^k a_2 = 0 \quad (3)$$

If this is not zero, the function will be discontinuous at the edges and the Fourier transform of the resulting weighting function will roll-off as $1/f$. Taking the first derivative with respect to t of the weighting functions, $$\omega'_K(t) = \frac{2\pi}{N}\sum_{k=0}^{K} a_k \sin\left(\frac{2\pi tk}{NT}\right) \quad (4)$$

which will evaluate to zero at the edges. In fact, all odd order derivatives will evaluate to zero on the edges. The second order derivative of the weighting function is:

$$\omega''_K(t) = \frac{4\pi^2}{N}\sum_{k=0}^{K} k^2 a_k \cos\left(\frac{2\pi tk}{NT}\right) \quad (5)$$

this evaluates to:

$$-\frac{4\pi^2}{N}\sum_{k=0}^{K} (-1)^k k^2 a_k \quad (6)$$

at the edges. If the coefficients are chosen so that equation (6) evaluates to zero, then the sidelobes decay at least at a rate of $1/f^5$. If not, the sidelobes decay at least at a rate of $1/f^3$. In general, the Fourier representation of the class of windows in equation (2) can be written as:

$$W(f) \sim \frac{1}{\pi L f}\sum_{m=0}^{\infty}\frac{1}{(Lf)^{2m}}\sum_{k=0}^{K}(-1)^k k^{2m} a_k \quad (7)$$

and will have asymptotic behavior determined by the first nonzero term in the m-series. For any even order derivative of equation (2)

$$\lim_{t \to edges} \omega^n(t) \sim \sum_{k=0}^{K}(-1)^k k^n a_k \quad (8)$$

If the coefficients are chosen to satisfy these equations, then the sidelobe level will roll-off at a rate $1/f^{2n+1}$, where n is the first even order derivative such that coefficients do not satisfy the continuity equation specified by that order derivative (equation (8) does not evaluate to zero). This is how the binomial shift invariant weighting functions are determined. Based on the order (K), as many of these equations (continuity at the edges) as possible are satisfied. The Hanning window weights satisfy the condition that the function evaluates to zero at the edges (equation (3)). The Hamming and Blackman windows offset the magnitudes of the off-center weights in an attempt to cancel the mainlobe in the frequency domain. In doing so, lower first sidelobe levels are obtained, but roll-off is sacrificed since the number of continuity equations that can be solved are not solved. The present invention builds on the window that satisfies one less than the number of continuity equations that can be specified by the order of the raised cosine window and then does an optimization to find the lowest first sidelobe level with the last degree of freedom. The present invention optimizes the mean square sense binwise in the frequency domain.

Thus, the present invention is a multi-apodization/spatial variant apodization (SVA) method. To visualize multi-apodization consider simultaneously processing a signal through several window/FFT/magnitude paths having different windows as shown in prior art FIG. 1. The minimum magnitude binwise across the different window paths is then chosen. This minimizes the sidelobe interference with respect to this set of windows. The magnitude of the windows are normalized to unity gain for the bin under test. In FIG. 1, N windows/FFT/-magnitudes are run on the same data segment. The smallest value is then chosen binwise across the different windows. This has the disadvantage that a large amount of computation is necessary versus the normal window/FFT type processing load.

Multi-apodization techniques of the present invention are applied with the two term raised cosine window function (order of two) that has a distinct 3-point convolution formulation in the frequency domain. By formulating a minimization problem for the bin selection, a single parameter is chosen binwise and only one 3-point convolution is performed on the data segment per frequency bin. The discrete raised cosine window of order one is given by:

$$\omega_1(n) = 1 - a\cos\left(\frac{2\pi n}{N}\right) \quad (9)$$

for $0 \leq n \leq N-1$. To compare across many windows, the peak index must be normalized to unit gain. Instead of normalizing the some of all coefficients to one as in the prior art, the center coefficient is fixed to one. This window comprises some of the basic window functions like rectangular ($\alpha=0$), Hamming ($\alpha=0.85$), and Hanning ($\alpha=1.0$) depending on the choice of $\alpha$. In the frequency domain this is calculated as:

$$Y_m = X_m - \alpha(X_{m-1} - X_{m+1})/2 \quad (10)$$

here $X_m$ is the frequency information in bin m, with no windowing (this is sometimes referred to as rectangular) and $Y_m$ is the post windowed frequency information at bin m.

If $\alpha$ is minimized within the range of 0 (a rectangular window) and 1.0 (Hanning), per frequency bin, then the minimum sidelobe interference for the class of windows described in (1) is assured. The spatial-variant-apodization (SVA) technique evaluates:

$$\min_{0 \le \alpha \le 1.0} |Y(\min: 0, N-1)|^2 \quad (11)$$

In closed form this yields $$\alpha_m = \text{Re}\left(-\frac{X_m}{X_{m-1} + X_{m+1}}\right) \quad (12)$$

Checks must be made on the value of $\alpha_m$ to ensure that it is between 0 and 1.0. Thus, using the optimal parameter $\alpha_m$ binwise, results in the following:

$$\begin{aligned} Y_{m,1} &= X_m & \alpha_m \le 0 & \quad (13)\\ &= X_m + \alpha_m(X_{m-1} + X_{m+1})/2 & 0 \le \alpha_m \le 1.0 &\\ &= X_m + (X_{m-1} + X_{m-1})/2 & \alpha_m > 1.0 & \end{aligned}$$

Figure 2:
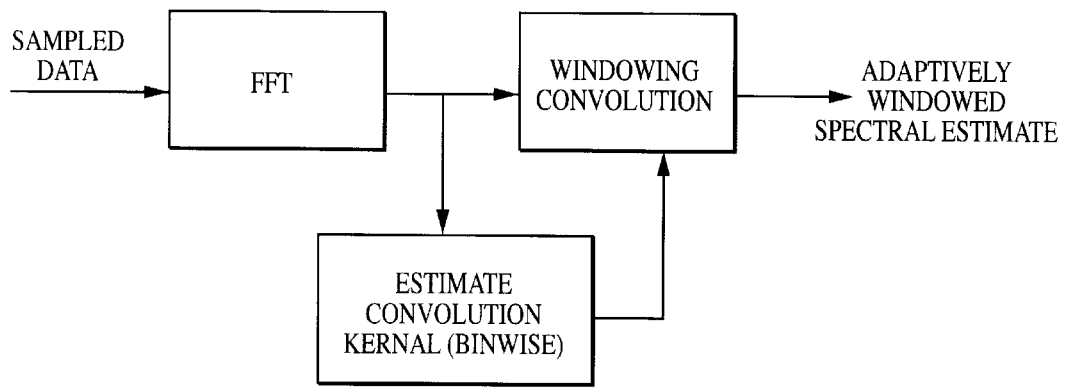
FIG. 2 is a diagram showing adaptive raised-cosine type windowing according to the present invention.

FIG. 2 depicts the processing necessary to adaptively window a data sequence according to the present invention.

For an order 2 raised cosine window that yields a 5-point convolution formula, the window processing in the Fourier domain is described as $$Y_{m,2} = X_m - \frac{\alpha_{m,2:1}}{2} X_{m11} + \frac{\alpha_{m,2:2}}{2} X_{m22} \quad (14)$$

where $\alpha_{m,2:1}$ and $\alpha_{m,2:2}$ are coefficients for the raised cosine window of order 2 that are dependent on the frequency bin under test, and $X_{m11} = X_{m-1} + X_{m+1}$, and $X_{m22} = X_{m-2} + X_{m+2}$. So that the frequency can be compared, the normalization $\alpha_{m,2:0} = 1$ has been implicitly defined. If we stipulate the first continuity equation, i.e., $$1 - \alpha_{m,2:1} + \alpha_{m,2:2} = 0 \quad (15)$$

then this gives a 5-point convolution formula in terms of one undetermined coefficient, $$Y_{m,2} = X_m - \frac{\alpha_{m,2:1}}{2} X_{m11} + \frac{(\alpha_{m,2:1} - 1)}{2} X_{m22} \quad (16)$$

Grouping the terms and dropping the index across coefficients for clarity, then:

$$Y_{m,2} = (X_m - X_{m22}/2) - \alpha_{m,2}(X_{m11}/2 - X_{m22}/2) \quad (17)$$

Taking the derivative of the magnitude squared of $Y_{m,2}$ binwise across m and setting it equal to zero gives:

$$\frac{d}{d\alpha_{m,2}} |Y_{m,2}|^2 = 0 \quad (18)$$

gives $$\alpha_{m,2} = \text{Re}\left(\frac{X_m - X_{m22}/2}{X_{m11}/2 - X_{m22}/2}\right) \quad (19)$$

This equation is similar in form to equation (12) for an original 3-point convolution formula.

To obtain bounds on the range of allowable values for $\alpha_{m,2}$ the equation is written in the time domain as:

$$\omega_n(n) = 1 - \alpha_2 \cos(2\pi n/N) + (\alpha_2 - 1)\cos(4\pi n/N) \quad (20)$$

This equation does not represent(s) the window used since $\alpha_2$ is dependent on the frequency. However, it is representative of the class of windows that are used to effectively choose the window to use on a frequency bin per frequency bin basis. If equation (20) is solved for the max and min $\alpha$ to use constrained by the minimum of $\omega_2(n)$ staying positive, i.e., choosing an upper/lower bound on $\alpha$;

$$\max_{\alpha} \min_{n} \omega_2(n) \ge 0 \quad (21)$$

and $$\min_{\alpha} \min_{n} \omega_2(n) \ge 0 \quad (22)$$

are satisfied for all n. By taking the derivative of equation (20) with respect to n, setting this equal to zero and finding the min and max $\alpha$ at these points such that equation (20) stays positive reveals that:

$$\alpha_{min} = 0 \quad (23)$$

and $$\alpha_{max} = (4/3) \quad (24)$$

Thus, $$\begin{aligned} Y_{m,2} &= X_{m22}/2 & \alpha_m \le 0 & \quad (25)\\ &= X_m - \alpha_m X_{m11}/2 + (\alpha_m - 1)X_{m22}/2 & 0 \le \alpha_m \le (4/3) &\\ &= X_m - (2/3)X_{m11} + (1/6)X_{m22} & \alpha_m \ge (4/3) & \end{aligned}$$

For the order 3 raised cosine window that yields a 7-point convolution formula, the window processing in the Fourier domain is described as $$Y_{m,3} = X_m - \frac{\alpha_{m,3:1}}{2} X_{m11} + \frac{\alpha_{m,3:2}}{2} X_{m22} - \frac{\alpha_{m,3:3}}{2} X_{m33} \quad (26)$$

By requiring that two continuity equations be satisfied, i.e., $$1 - \alpha_{m,3:1} + \alpha_{m,3:2} - \alpha_{m,3:3} = 0 \quad (27)$$

and $$-\alpha_{m,3:1} + 4\alpha_{m,3:2} - 9\alpha_{m,3:3} = 0 \quad (28)$$

after dropping unnecessary subscripts and grouping terms results in:

$$Y_{m,3} = X_m - \frac{\alpha_{m,3}}{2} X_{m11} + (0.8\alpha_{m,3} - 0.9)X_{m22} - (0.3\alpha_{m,3} - 0.4)X_{m33} \quad (29)$$

where $X_{m33} = X_{m-3} + X_{m+3}$. Solving for $\alpha_{m,3}$, which minimizes $|Y_{m,3}|^2$ yields:

$$\alpha_{m,3} = \text{Re}\left(\frac{X_m - 0.9X_{m22} + 0.4X_{m33}}{0.5X_{m11} - 0.8X_{m22} + 0.3X_{m33}}\right) \quad (30)$$

Writing the pre-FFT domain windowing function, $$\omega_3(n) = \qquad (31)$$

$$1 - \alpha_3\cos\left(\frac{2\pi n}{N}\right) + (1.6\alpha_3 - 1.8)\cos\left(\frac{4\pi n}{N}\right) - (o.6\alpha_3 - 0.8)\cos\left(\frac{6\pi n}{N}\right)$$

by solving for the max and min α that keep this equation positive for all n yields $$\alpha_{max}=1.5 \qquad (32)$$

and $$\alpha_{min}=0.5 \qquad (33)$$

Thus, $$Y_{m,3} = X_m - 0.9X_{m22} + 0.4X_{m33} \qquad \alpha_m \le 0.5 \qquad (34)$$

$$= X_m - 0.5\alpha_m X_{m11} + (0.8\alpha_m - 0.9)X_{m22} - \quad 0.5 \le \alpha_m \le 1.5$$

$$(0.3\alpha_m - 0.4)X_{m33}$$

$$= X_m - 0.75X_{m11} + 0.3X_{m22} - 0.05X_{33} \qquad \alpha_m > 1.5$$

Figure 3A:
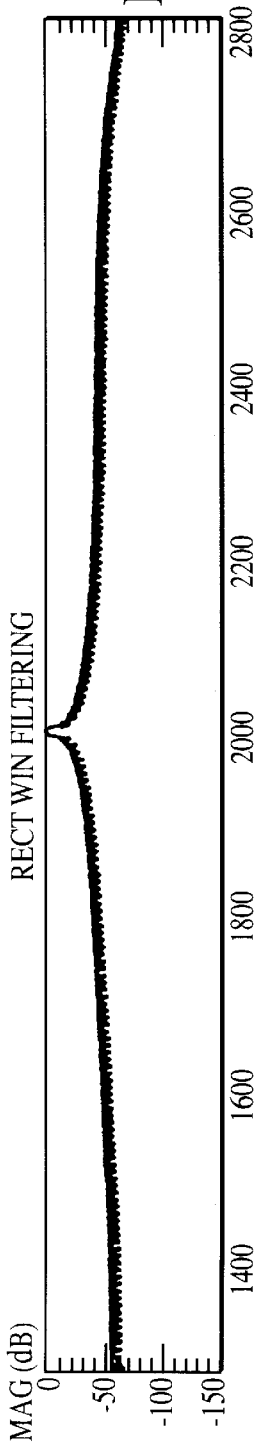
FIGS. 3A, 3B, 3C, 3D, 3E, 3F and 3G are spectral plots of a single tone windowed in the frequency domain with rectangular window filtering, Hanning window filtering, Blackman window filtering, adaptive windowing-3 point, adaptive windowing-5 point, adaptive windowing, adaptive windowing-7 point and multi-adaptive windowing, respectively.
Figure 3B:
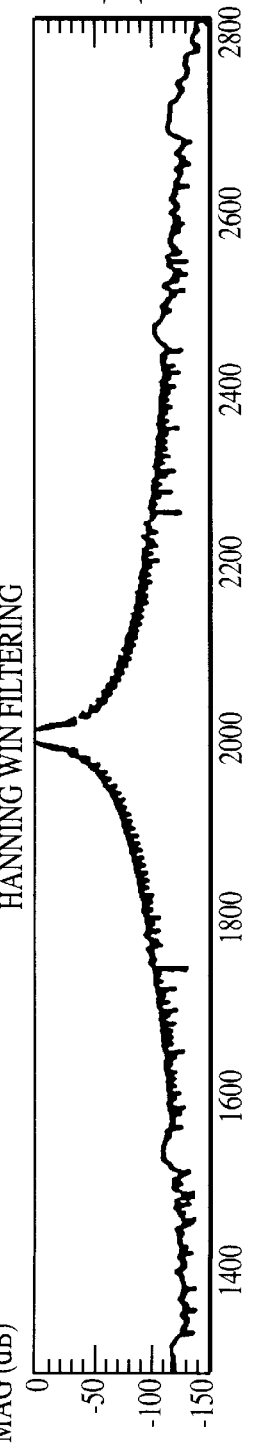
Figure 3C:
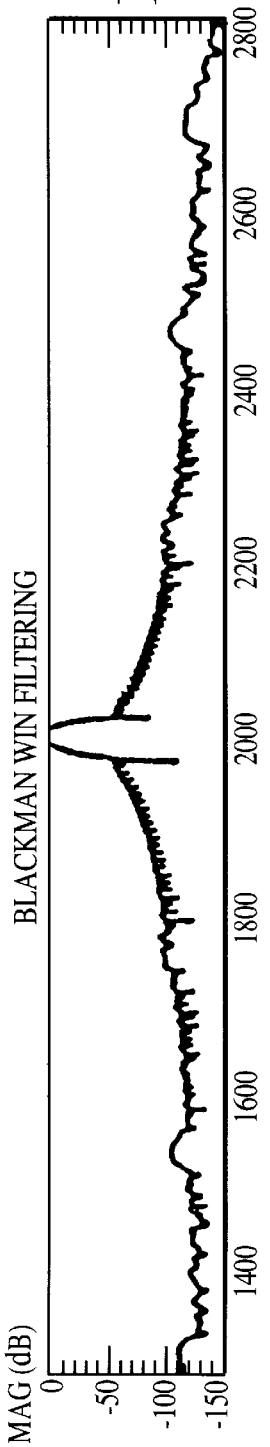
Figure 3D:
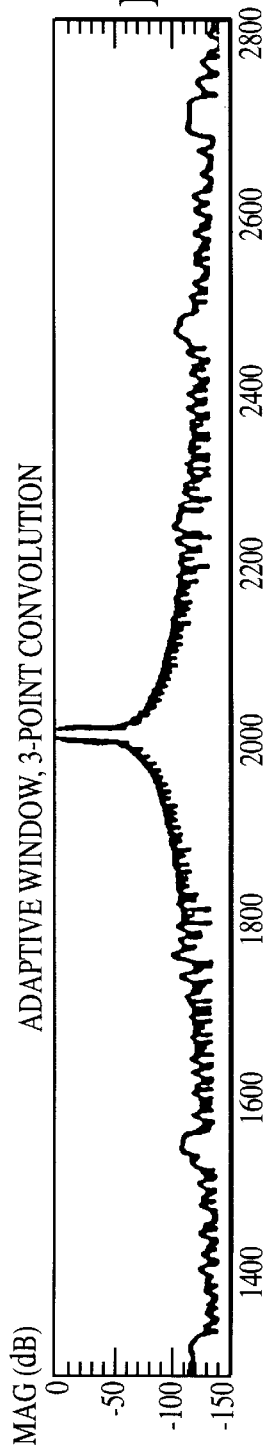
Figure 3E:
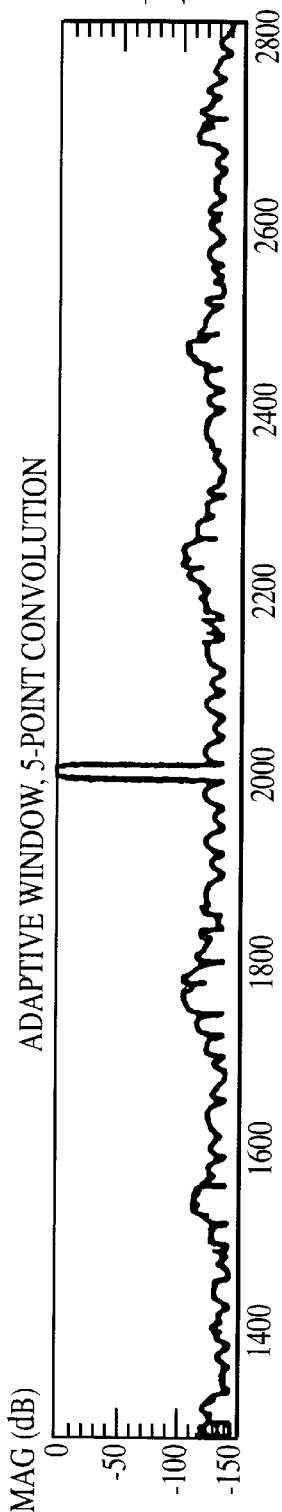
Figure 3F:
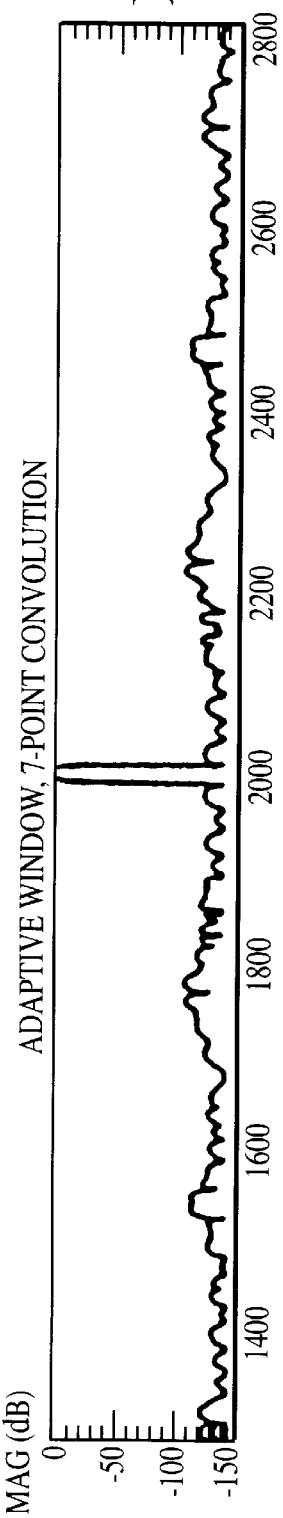
Figure 3G:
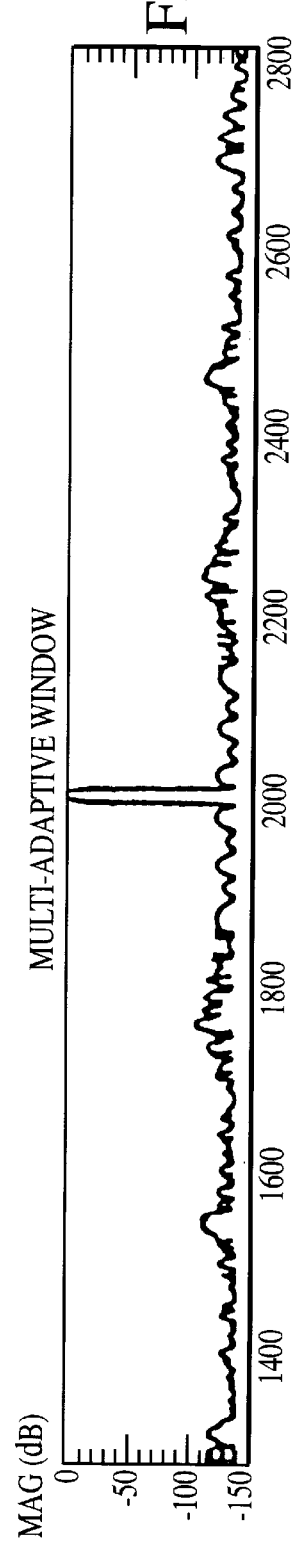
Figure 4E:
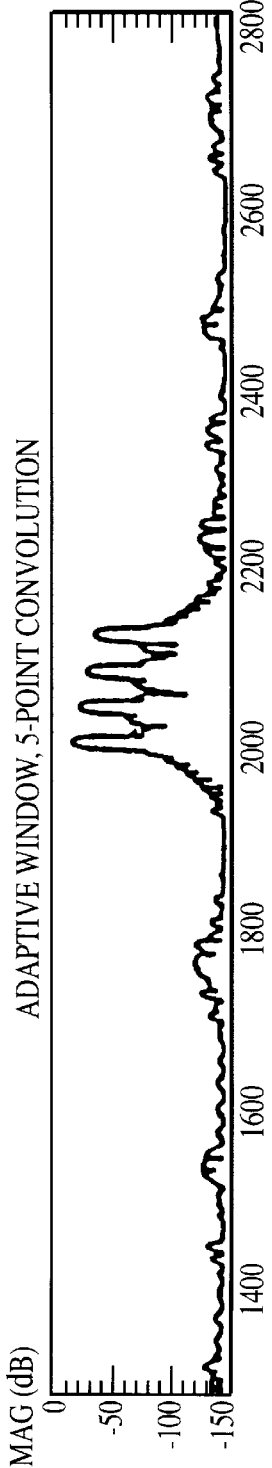
Figure 4F:
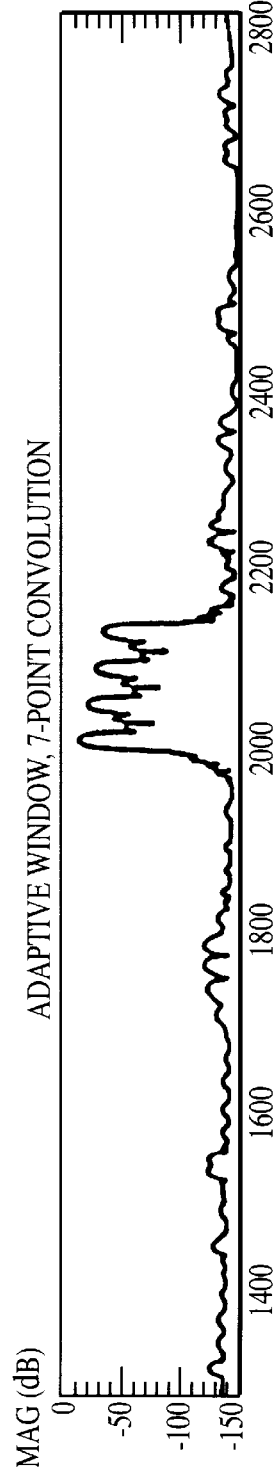
Figure 4G:
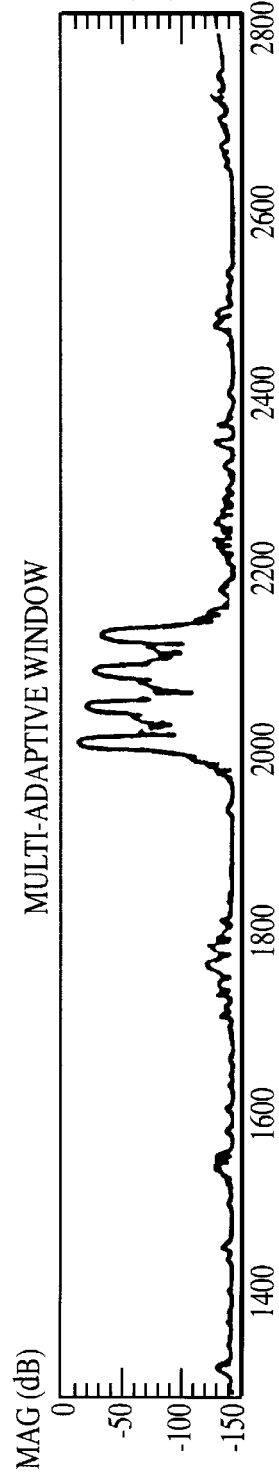
Figure 6A:
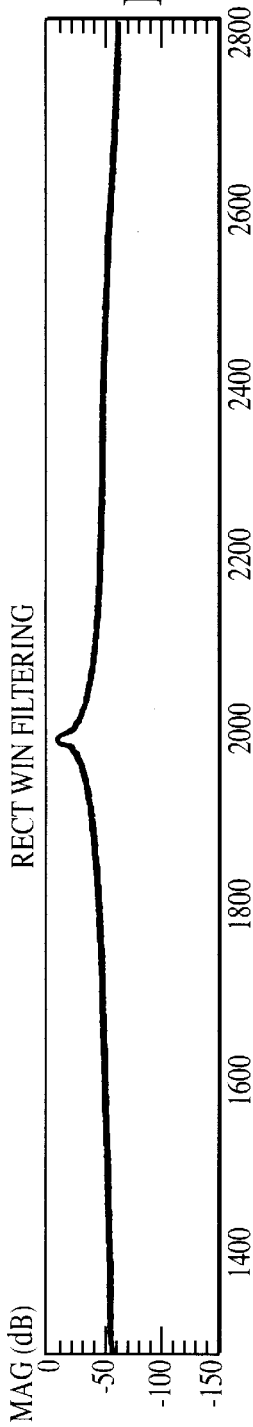
Figure 6B:
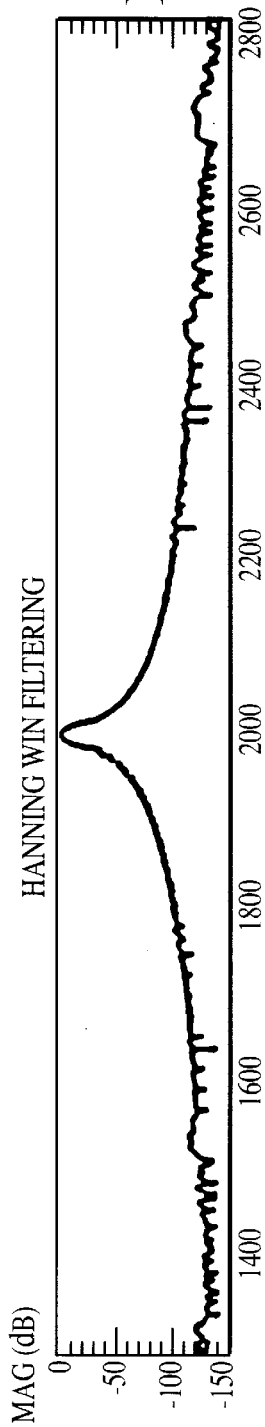
Figure 6C:
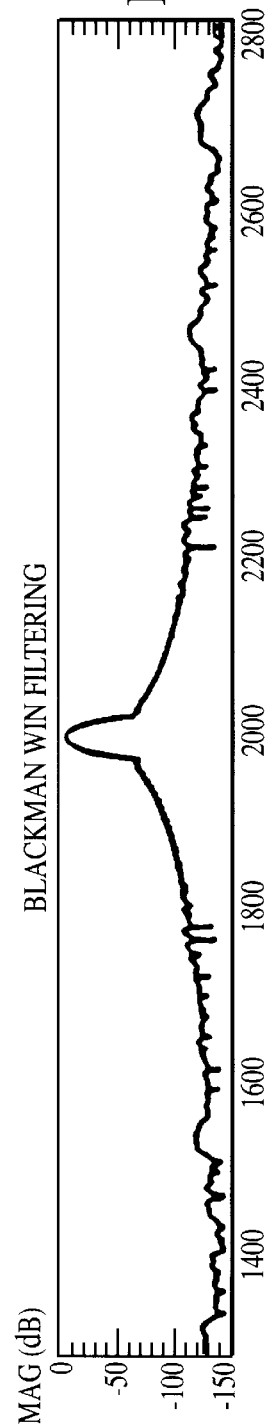
Figure 6D:
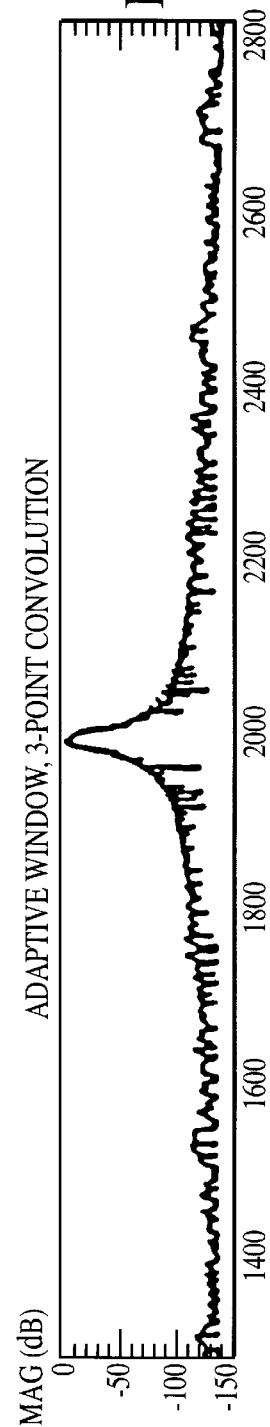

FIG. 3A is a single tone widowed in the frequency domain with no windowing, FIG. 3B is the Hanning windowing, FIG. 3C is the Blackman windowing, FIGS. 3D, 3E and 3F are 3,5 and 7-point adaptive windowing formulas, and FIG. 3G is a multi-apodization type window across all 3 adaptive windows (best of 3,5,7 point convolution windows). Since the coefficients are data dependent, there is no simple way to compute the frequency response of the windowing. As shown in FIGS. 3D, 3E and 3F, the sidelobes are low for all three adaptive windows. The 7-point convolution is spread a little wider than the other adaptive windows but not nearly as much as the Blackman (FIG. 3C-a 5-point convolution). These plots are the result of a 4096 point FFT having only 512 data points on a single tone. Massive zero padding is necessary to interpolate the sidelobes for visual inspection.

FIGS. 4A–4G are spectral plots having four closely spaced tones, approximately 5 data bins away from each other with decreasing amplitudes (approximately 6 dB between tones, lower amplitude with higher frequency). All the adaptive windows give a cleaner interpretation of the inter-tone energy as well as much better sidelobe rejection on the edge of the set of tones.

Requiring the time domain or pre-FFT domain window to remain positive is not strictly necessary for simple spectra. If the window function goes negative, then it is conceivable that transient signals or otherwise complex spectra could be misrepresented. However, for simple spectra, assuming multiple tones separated by several bins, the representation could be enhanced by allowing values of α that would constitute a set of windows with negative regions. By allowing α to take on values such that the resulting set of windows may go negative implies that temporally, the signal of interest is being phase modulated as well as tapered at the edges (amplitude modulated). This effect would be similar to an amplitude modulated waveform where the carrier wave becomes over-modulated, resulting in envelope distortion and phase reversals.

FIGS. 5A–5G are the same data as FIGS. 3A–3G with the minimum α being allowed to go to −10 instead of 0 for the 3 and 5 point convolutions, and 0.5 for the 7 point convolution. This appears to have increased the resolution. However, it has merely shaped the tone around the center of the spectral energy. If the resolution were increased then multiple tones could be separated spectrally as the inter-tone spacing decreases below one bin. FIGS. 6A–6G shows two tones separated by approximately 0.5 data bins with all adaptive windows having α clamped at −10. As can be seen, the resolution has not increased.

The other aspect of spectral representation is the signal to noise ratio. The signal to noise ratio for a single tone in noise is defined as:

$$S/N = 20\log_{10}(|F_{peak}|) - 20\log_{10}\left(\sum_{i=0,i\ne peak}^{N} |F_i|\right) \qquad (35)$$

Where $F_i$ is the complex frequency information after windowing in bin i, and $F_{peak}$ is the frequency information at the tone bin.

Figure 7:
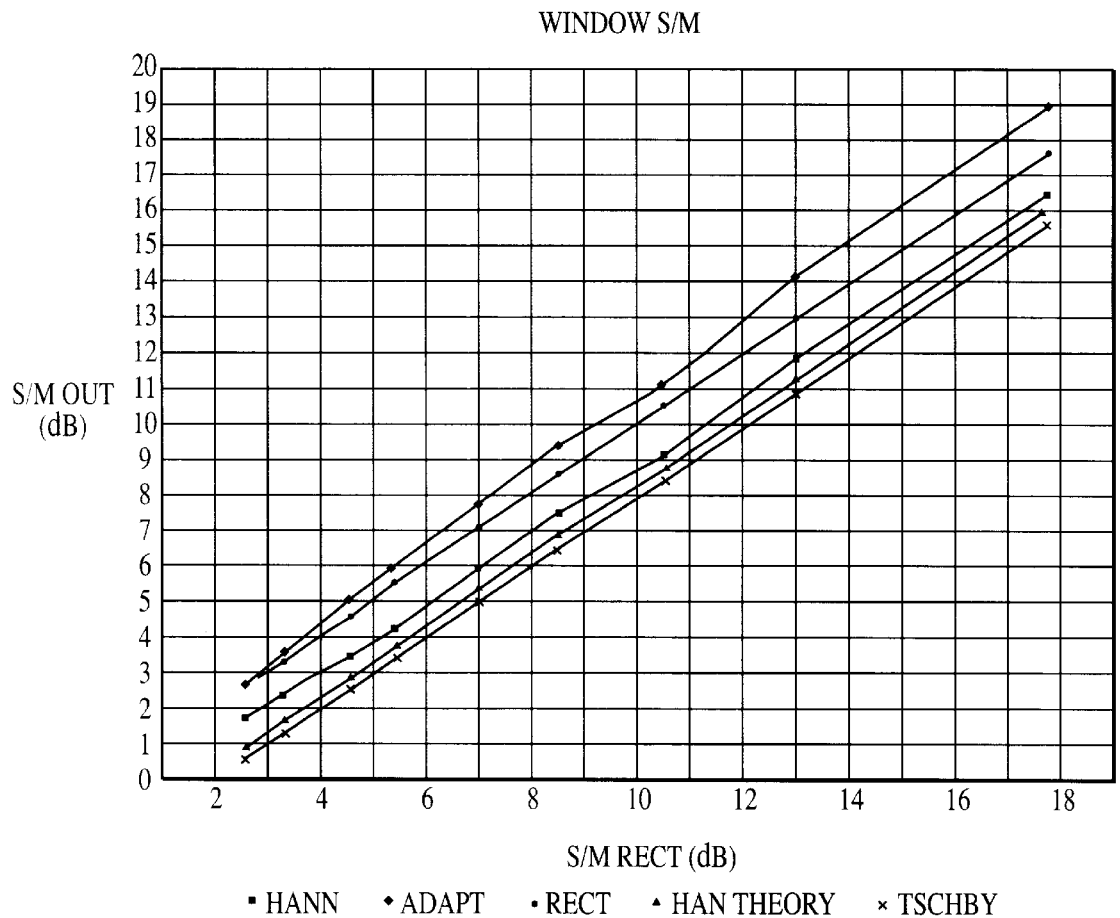
FIG. 7 is a graph showing the signal-to-noise ratio for various windows.
Figure 8A:
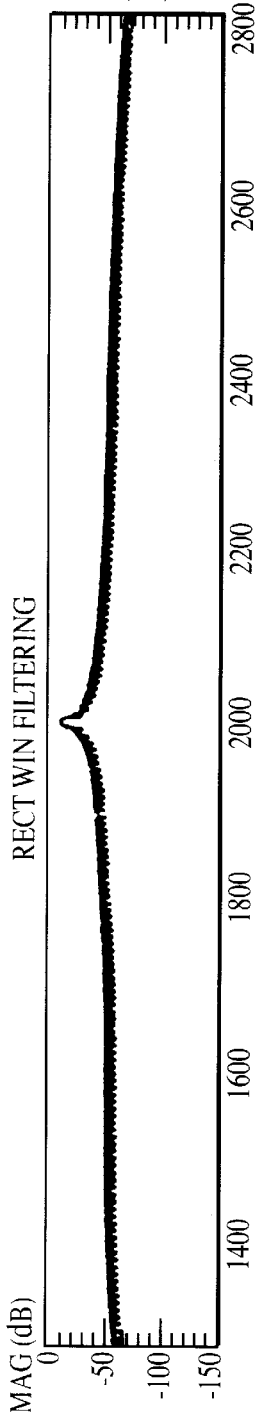
Figure 8B:
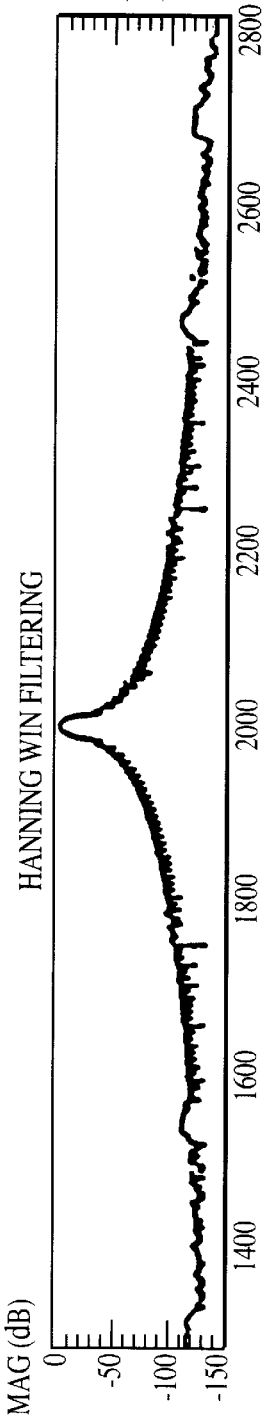
Figure 8C:
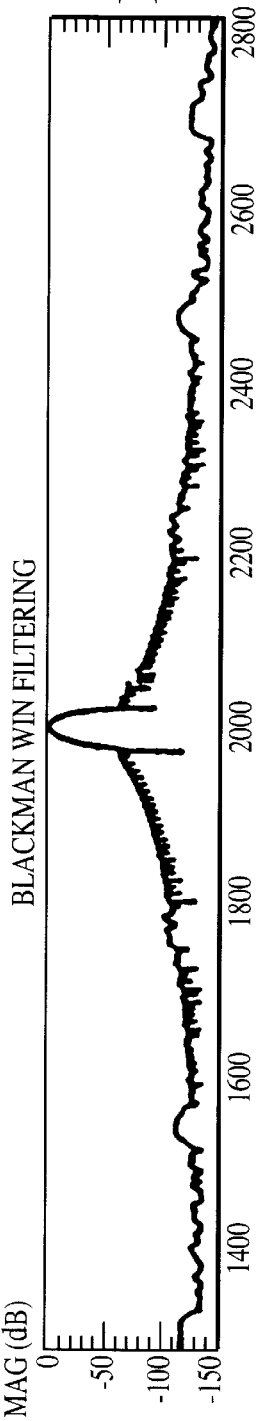
Figure 8D:
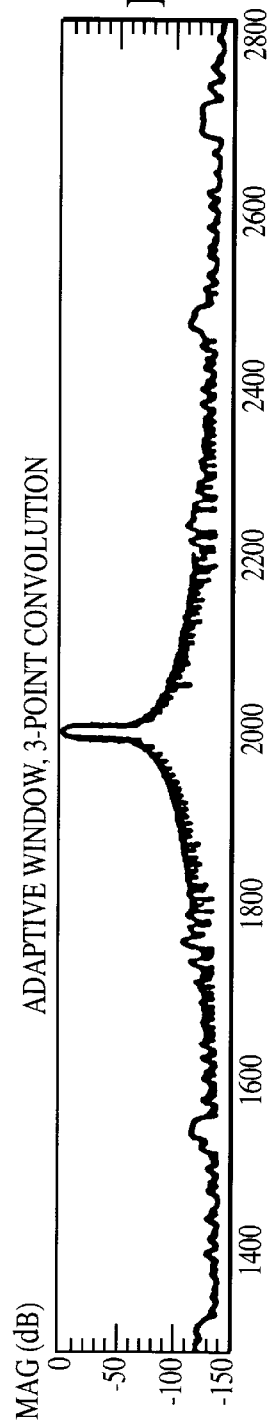

The rectangular window has the highest signal to noise ration of any of the static windows. This is because the spreading of energy, which any static window does, except the rectangular window, takes energy from the signal bin and smears it into neighboring bins, which reduces signal energy. FIG. 7 is a plot of the S/N for the windows previously used plotted against the S/N of the rectangular window. As shown, the only windows with a higher S/N than the rectangular window are the adaptive windows. This data is from a real-time processing system having a single tone input. The FFTs were averaged for a long time to reduce the variance of the spectral estimate. The 3-point convolution form adaptive weighting was used for this comparison. The comparison shows that the similar and better results than the 3-point form adaptive window.

The adaptive windowing techniques of the present invention make it well suited to applications where the detection or tracking of small tones is required. The increased side lobe rejection makes these adaptive windows well suited to applications where corruption from nearby unwanted spectral energy may mask or perturb the desired spectral component. FIGS. 8A–8G are spectral plots having the same windows used previously with one dominant tone at bin 2000 and one small amplitude tone at bin 2050 that, depending on windowing, may go unnoticed or masked. The higher order adaptive windows reveal energy at the smaller tone bin location even though it visually has the appearance of a more complex spectral structure. This ability to reduce sidelobe leakage has proved to be a valuable property of these adaptive windows.

Thus, the present invention is focused on extending the non-static shift-variant data adaptive window generated from a technique referred to as spatial variant apodization. The extensions are made using the window structure of multiple cosines because of its simple transform domain convolution formulas. The present invention extends the prior adaptive windowing to 5 and 7 point convolution formulas. The sidelobe leakage of the adaptive windows is shown to be extremely small when compared to conventional windowing techniques. In addition, the signal to noise ration for the adaptive windows is shown to be higher than the rectangular window. That is effective noise bandwidth is less than the rectangular window. Finally, a spectral detection is shown to be possible with the higher order windowing of the present invention when no detection would have been made with previous windowing techniques. The present invention has many applications including, but not limited to use in the medical field.

The present invention has many applications including, but not limited to use in the medical field. Realization of the invention is preferably through microprocessor technology dedicated to provide the means for manipulating data according to the special case functions taught herein. Specific applications are case dependant and subject to wide variations due to advancements in microprocessor technology, data type, environment and related hardware consideration. Given the functions developed herein, such varied applications are within the grasp of anyone reasonably skilled in the related art. Therefore, no attempt has been made to present an exemplary application for fear of misleading the reader or unnecessarily limiting the scope of the invention.

The foregoing is considered as illustrative only of the principles of the invention. Further, since numerous modifications and changes will readily occur to those skilled in the art, it is not desired to limit the invention to the exact construction and applications shown and described, and accordingly, all suitable modifications and equivalents may be resorted to, falling within the scope of the invention and the appended claims and their equivalents.

What is claimed is:

1. An apparatus for processing a data sequence, comprising:
    means for sampling data from said data sequence according to a raised cosine time-domain window function;
    means for processing said sampled data by a fast Fourier transform function; and
    means for adaptively convolving said fast Fourier transform processed data.

2. An apparatus for processing a data sequence as defined by claim 1, wherein said raised cosine time-domain window function is raised to at least the second order.

3. An apparatus for processing a data sequence using adaptive windowing and Fourier based spectral analysis, comprising:
    means for processing a data sequence by way of a second-order raised cosine window, wherein window processing in the Fourier domain is defined by the function $$Y_{m,2} = X_m - \frac{\alpha_{m,2:1}}{2} X_{m11} + \frac{\alpha_{m,2:2}}{2} X_{m22} \tag{14}$$

where $\alpha_{m,2:1}$ and $\alpha_{m,2:2}$ represent the coefficients for the raised cosine window dependent on the frequency bin under test;
    means for taking the derivative of the magnitude squared of $Y_{m,2}$ binwise across m and setting it equal to zero;
    means for determining the bonds for the range of allowable values for $\alpha_{m,2}$ in accordance with the function $$\alpha_{m,2} = \text{Re}\left(\frac{X_m - X_{m22/2}}{X_{m11}/2 - X_{m22}/2}\right) \tag{19}$$

means for defining a pre-FFT domain function of said second-order raised cosine window as the function $$\omega_n(n) = 1 - \alpha_2 \cos(2\pi n/N) + (\alpha_2 - 1)\cos(4\pi n/N) \tag{20}$$

means for determining the maximum and minimum according to the functions $$\max_\alpha \min_n \omega_2(n) \geq 0 \tag{21}$$

and $$\min_\alpha \min_n \omega_2(n) \geq 0 \tag{22}$$

means for determining the derivative of said pre-FFT domain function $$\omega_n(n) = 1 - \alpha_2 \cos(2\pi n/N) + (\alpha_2 - 1)\cos(4\pi n/N) \tag{20}$$

with respect to n; and
    means for expanding said Fourier domain function into $$Y_{m,2} = X_{m22}/2 \qquad \alpha_m \leq 0 \tag{25}$$
$$= X_m - \alpha_m X_{m11}/2 + (\alpha_m - 1)X_{m22}/2 \quad 0 \leq \alpha_m \leq (4/3)$$
$$= X_m - (2/3)X_{m11} + (1/6)X_{m22} \qquad \alpha_m \geq (4/3).$$

4. A method for processing a data sequence using adaptive windowing and Fourier based spectral analysis, including the steps of:
    processing a data sequence by way of a second-order raised cosine window, wherein window processing in the Fourier domain is defined by the function $$Y_{m,2} = X_m - \frac{\alpha_{m,2:1}}{2} X_{m11} + \frac{\alpha_{m,2:2}}{2} X_{m22} \tag{14}$$

where $\alpha_{m,2:1}$ and $\alpha_{m,2:2}$ represent the coefficients for the raised cosine window dependent on the frequency bin under test;
    taking the derivative of the magnitude squared of $Y_{m,2}$ binwise across m and setting it equal to zero;
    determining the bounds for the range of allowable values for $\alpha_{m,2}$ in accordance with the time domain function $$\alpha_{m,2} = \text{Re}\left(\frac{X_m - X_{m22/2}}{X_{m11}/2 - X_{m22}/2}\right) \tag{19}$$

defining a pre-FFT domain function of said second-order raised cosine window as the function $$\omega_n(n) = 1 - \alpha_2 \cos(2\pi n/N) + (\alpha_2 - 1)\cos(4\pi n/N) \tag{20}$$

determining the maximum and minimum α according to the functions $$\max_\alpha \min_n \omega_2(n) \geq 0 \tag{21}$$

and $$\min_\alpha \min_n \omega_2(n) \geq 0 \tag{22}$$

determining the derivative of said pre-FFT domain function $$\omega_n(n) = 1 - \alpha_2 \cos(2\pi n/N) + (\alpha_2 - 1)\cos(4\pi n/N) \tag{20}$$

with respect to n; and
    expanding said Fourier domain function into $$Y_{m,2} = X_{m22}/2 \qquad \alpha_m \leq 0$$
$$= X_m - \alpha_m X_{m11}/2 + (\alpha_m - 1)X_{m22}/2 \quad 0 \leq \alpha_m \leq (4/3)$$
$$= X_m - (2/3)X_{m11} + (1/6)X_{m22} \qquad \alpha_m \geq (4/3).$$

5. A method for processing a data sequence using adaptive windowing and Fourier based spectral analysis, including the steps of:
    processing a data sequence by way of a third-order raised cosine window, wherein window processing in the Fourier domain is defined by the function $$Y_{m,3} = X_m - \frac{\alpha_{m,3:1}}{2}X_{m11} + \frac{\alpha_{m,3:2}}{2}X_{m22} - \frac{\alpha_{m,3:3}}{2}X_{m33} \quad (26)$$

where $\alpha_{m,3:1}$, $\alpha_{m,3:2}$ and $\alpha_{m,3:3}$ represent the coefficients for the raised cosine window dependent on the frequency bin under test;

taking the derivative of the magnitude squared of binwise across;

determining the bounds for the range of allowable values for in accordance with the function $$\alpha_{m,3} = Re\left(\frac{X_m - 0.9X_{m22} + 0.4X_{m33}}{0.5X_{m11} - 0.8X_{m22} + 0.3X_{m33}}\right) \quad (30)$$

defining a pre-FFT domain function of said third-order raised cosine window as the function $$\omega_3(n) = 1 - \alpha_3\cos\left(\frac{2\pi n}{N}\right) + \quad (31)$$
$$(1.6\alpha_3 - 1.8)\cos\left(\frac{4\pi n}{N}\right) - (o.6\alpha_3 - 0.8)\cos\left(\frac{6\pi n}{N}\right)$$

determining the maximum and minimum which keeps positive for all in said pre-FFT domain function; and expanding said Fourier domain function into $$Y_{m,3} = X_m - 0.9X_{m22} + 0.4X_{m33} \quad \alpha_m \leq 0.5 \quad (34)$$

-continued
$$= X_m - 0.5\alpha_m X_{m11} + (0.8\alpha_m - 0.9)X_{m22} - \quad 0.5 \leq \alpha_m \leq 1.5$$
$$(0.3\alpha_m - 0.4)X_{m33}$$
$$= X_m - 0.75X_{m11} + 0.3X_{m22} - 0.05X_{33} \quad \alpha_m > 1.5.$$

6. An apparatus for processing a data sequence using adaptive windowing and Fourier based spectral analysis, comprising:

means for processing a data sequence by way of a third-order raised cosine window for developing a pre-FFT domain function defined by $$\omega_3(n) = 1 - \alpha_3\cos\left(\frac{2\pi n}{N}\right) + \quad (31)$$
$$(1.6\alpha_3 - 1.8)\cos\left(\frac{4\pi n}{N}\right) - (o.6\alpha_3 - 0.8)\cos\left(\frac{6\pi n}{N}\right)$$

and means for expanding said pre-FFT domain function into a Fourier based spectral analysis function defined by $$Y_{m,3} = X_m - 0.9X_{m22} + 0.4X_{m33} \quad \alpha_m \leq 0.5 \quad (34)$$
$$= X_m - 0.5\alpha_m X_{m11} + (0.8\alpha_m - 0.9)X_{m22} - \quad 0.5 \leq \alpha_m \leq 1.5$$
$$(0.3\alpha_m - 0.4)X_{m33}$$
$$= X_m - 0.75X_{m11} + 0.3X_{m22} - 0.05X_{33} \quad \alpha_m > 1.5.$$

* * * * *